US006366134B1

(12) United States Patent
Deng

(10) Patent No.: US 6,366,134 B1
(45) Date of Patent: Apr. 2, 2002

(54) CMOS DYNAMIC LOGIC CIRCUITRY USING QUANTUM MECHANICAL TUNNELING STRUCTURES

(75) Inventor: Xiaoweo Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/649,392

(22) Filed: Aug. 28, 2000

Related U.S. Application Data

(60) Provisional application No. 60/154,290, filed on Sep. 16, 1999.

(51) Int. Cl.[7] .............................................. H03K 19/10
(52) U.S. Cl. ..................... 326/121; 326/95; 326/119; 326/134
(58) Field of Search ................................. 326/133–135, 326/93, 95, 98, 112, 119, 121

(56) References Cited

U.S. PATENT DOCUMENTS

| | | | | | |
|---|---|---|---|---|---|
| 4,352,031 A | * | 9/1982 | Holbrook et al. | ............ | 326/121 |
| 5,018,107 A | * | 5/1991 | Yoshida | ........................ | 326/112 |
| 5,903,170 A | * | 5/1999 | Kilkarni et al. | ............. | 326/134 |

* cited by examiner

Primary Examiner—Michael Tokar
Assistant Examiner—Don Phu Le
(74) Attorney, Agent, or Firm—Pedro P. Hernandez; W. James Brady, III; Frederick J. Telecky, Jr.

(57) ABSTRACT

CMOS semiconductor dynamic logic (300) is disclosed, comprising dynamic logic circuitry (302) and tunneling structure circuitry (328) coupled to the dynamic logic circuitry; where the tunneling structure circuitry is adapted to hold a node (308) voltage stable by compensating leakage current originating from said dynamic logic circuitry.

15 Claims, 2 Drawing Sheets

CMOS DYNAMIC LOGIC CIRCUITRY USING QUANTUM MECHANICAL TUNNELING STRUCTURES

This application claims priority under 35 USC §119(e)(1) of provisional application Ser. No. 60/154,290 filed Sep. 19, 1999. +gi The U.S. Government has a paid-up license in this invention and the right in limited circumstances to require the patent owner license others on reasonable terms as provided for by the terms of F49620-96-C-0006 awarded by DARPA.

TECHNICAL FIELD OF THE INVENTION

The present invention relates, in general, to logic circuitry used in electronic devices, and in particular, to dynamic logic circuitry designed for a Complementary Metal Oxide Semiconductor (CMOS) process including quantum mechanical tunneling structures.

BACKGROUND OF THE INVENTION

The continual demand for enhanced transistor and integrated circuit performance has resulted in improvements in existing devices, such as silicon, bipolar, and Complementary Metal Oxide Semiconductor (CMOS) transistors and Galium Arsenide (GaAs) transistors, and also in the introduction of new device types and materials. In particular, scaling down device sizes to enhance high frequency performance leads to observable quantum mechanical effects, such as carrier tunneling through potential barriers. These effects led to development of alternative device structures which take advantage of such tunneling phenomenon; such as tunneling, and resonant tunneling, diodes and transistors. For ease of reference, all such structures are hereafter collectively referred to as tunneling diodes (TDs).

Tunneling diodes are generally two terminal devices with conduction carriers tunneling through potential barriers to yield current-voltage curves with portions exhibiting negative differential resistance (NDR). This negative differential resistance characteristic has been used as the basis for a wide range of high performance designs.

Conventionally, tunneling and resonant tunneling diodes have been limited in implementation to GaAs and other high performance processes. Conventional methods have focused on building TDs in GaAs for several reasons; mainly because the speed characteristics and small process features of GaAs processes were conducive to tunneling mechanics. However, performance considerations such as difficulty controlling peak current in TDs, limited their practical application and use. Additionally, since GaAs processes were not practical or cost efficient for high-volume, consumer-related production, TDs were generally limited in application to research and developmental applications.

Previously, the feature sizes of standard silicon processes, such as CMOS, were not conducive to producing such tunneling structures. Other conventional methods of utilizing tunneling structures in conjunction with standard silicon processes entailed fabrication of a TD structure in a non-silicon process, followed by transferring and bonding (or electrically coupling) the TD structure to a host silicon substrate. While certain performance issues may have thus been addressed, such a process required extra design time and processing steps. The additional design and fabrication costs associated with these approaches is therefore not commercially viable for large volume logic device production.

Thus, conventional implementations of tunneling structures have been used only in discrete form and niche applications, such as high speed pulse and edge generation; produced in costly, high-performance processes. Limitations to conventional tunneling structures include the difficulty in controlling peak current and the lack of an integrated circuit process capable of commercially producing tunneling structures in a commercially viable format.

In the absence of commercially viable TDs, conventional CMOS logic circuit designs have utilized functional components readily available in the CMOS process, such as inverters and logic and transmission gates. Conventional methods have focused on optimizing the design of these components individually, and improving their efficiency when utilized within larger circuits. Still, such conventional methods inevitably yield device inefficiency; due mainly to layout area, power consumption, and operational speed limits resulting from standard CMOS components.

As performance demands have increased and feature sizes for CMOS processes have decreased, fabrication of tunneling structures in a production CMOS process becomes feasible. Tunnel diode growth on silicon is relatively immature. Recently, CMOS compatible tunnel diodes have been demonstrated to show that a wide range of current densities can be obtained; addressing requirements for imbedded memory and signal processing applications.

Therefore, a system of logic circuitry designs incorporating tunneling structures for a CMOS process is now needed; providing enhanced design performance and efficiency while overcoming the aforementioned limitations of conventional methods.

SUMMARY OF THE INVENTION

Dynamic logic circuitry is used extensively in modern electronics systems and devices. Dynamic logic, being denser and more efficient than static logic implementations typical of CMOS designs, is widely used in demanding high-performance applications. As such, dynamic logic is prevalent in the design of systems such as signal processing units, encoding and decoding devices, and circuitry performing intensive mathematical operations.

In the present invention, dynamic logic circuitry is designed for a CMOS process including quantum mechanical tunneling structures; providing circuit layout area, power consumption, and operational speed advantages over conventional methods. NDR and current-voltage (I-V) characteristics of tunneling structures are exploited to provide high-performance, high functionality logic circuitry. Tunneling structures are utilized, replacing conventional CMOS components, to address MOS leakage and hold data state in dynamic logic circuits.

In one embodiment of the present invention, a dynamic logic network is designed incorporating tunneling diodes. The tunneling diodes replace a number of components used in conventional designs, providing high system performance with optimum design overhead.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention defines logic circuitry employing tunneling structures in a homogenous silicon process; providing increased performance and design optimization. The present invention provides reduced circuit complexity for dynamic logic circuits; decreasing the number of circuit components used, the number of interconnects, and the number of delay stages. The present invention thus realizes a significant reduction in layout area, operation delay, and power consumption over conventional methods. NDR and current-voltage (I-V) characteristics of tunneling structures are exploited to provide high-performance, high functionality logic circuitry.

For purposes of illustration, dynamic logic network circuitry utilizing resonant tunneling diodes (RTDs) is provided. However, the principles and applications of the present invention are not limited to just resonant tunneling diodes; being applicable to tunneling structures in general and hereafter collectively referred to as tunneling diodes (TDs). TDs are desirable for use in high performance logic circuit applications due to the fact that their switching speed is generally faster than standard MOS structures. TDs are well-known for their intrinsic bi-stability and high-speed switching capability due to their negative differential resistance (NDR) characteristic. High current density, low capacitance, and the NDR of TDs make them very fast non-linear circuit elements. These same device characteristics can be exploited in high-speed, low-power, digital logic circuits. Thus, in most general purpose applications, where a large fraction of the circuits may be idle at any given time, the present invention provides a significant advantage over conventional methods because CMOS structures have lower tunnel power dissipation due to very low static power consumption.

Figure 1:
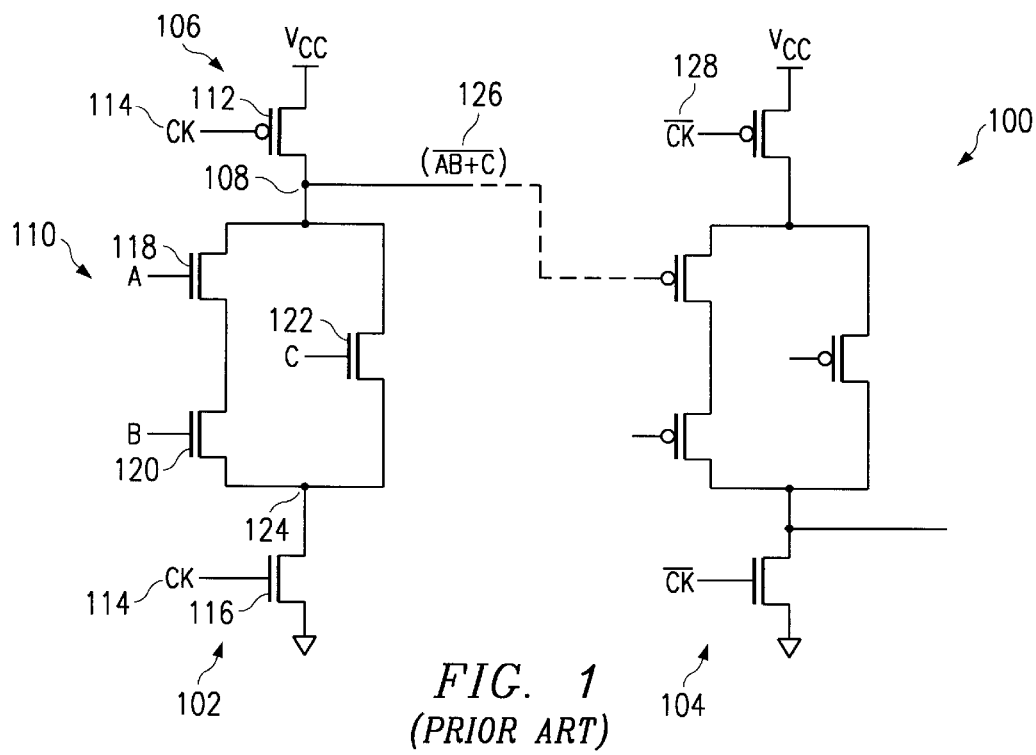
FIG. 1 is a schematic of a prior art CMOS dynamic logic circuit.

Referring now to FIG. 1, a schematic representative of a prior art dynamic logic circuit 100 is shown. Circuit 100 implements an np-CMOS type of dynamic logic circuit, comprising multiple, serially-chained, stages such as n-type stage 102 and p-type stage 104. Stage 102 comprises pre-charge element 106 intercoupled between node 108 and a supply voltage ($V_{CC}$), and discharge element 110 intercoupled between node 108 and ground. Pre-charge element 106 comprises transistor 112 having a first terminal coupled to $V_{CC}$, a second terminal coupled to node 108, and an inverting base terminal coupled to a clock (CK) input 114. Discharge element 110 comprises an evaluation transistor 116 in combination with a network of transistors 118, 120, and 122. Transistor 116 has a first terminal coupled to node 124, a second terminal coupled to ground, and a base terminal coupled to clock input 114. Transistors 118 and 120 are coupled serially between nodes 108 and 124, having base inputs A and B, respectively. Transistor 122 is coupled between nodes 108 and 124 in parallel to transistors 118 and 120, and has base input C. Transistors 118–122 thus implement the Boolean condition 126 shown with the circuit.

Upon appropriate timing as relayed by clock input 114, typically referred to as the pre-charge phase, element 106 operates to raise the output voltage for stage 102, as measured at node 108, to a desired level(e.g. high or "1"). Responsive to input 114, circuit 100 then transitions into an evaluation phase, in which discharge element 110 plays a part. During evaluation phase, transistor 116 turns on, effectively evaluating the status of condition 126 as implemented by transistors 118–122. If condition 126 is satisfied, a path from node 108 to ground will be established through transistor 116 and either transistor 122 or the combination of transistors 118 and 120. Once this path to ground is established, the voltage at node 108 will be discharged to a low level, shifting the output of stage 102. Stage 104 is structured and operates similarly to stage 102, responsive to inverse clock input 128.

Such a design suffers negative impacts of MOS leakage. Circuit 100 as shown requires frequent refreshing to maintain the desired level at node 108. If circuit 100 is not so refreshed, voltage at node 108 my erroneously transition due to leakage, leading to data errors and system reliability issues. Consistent refresh ultimately results in significant increases in power consumption for such conventional systems.

Figure 2:
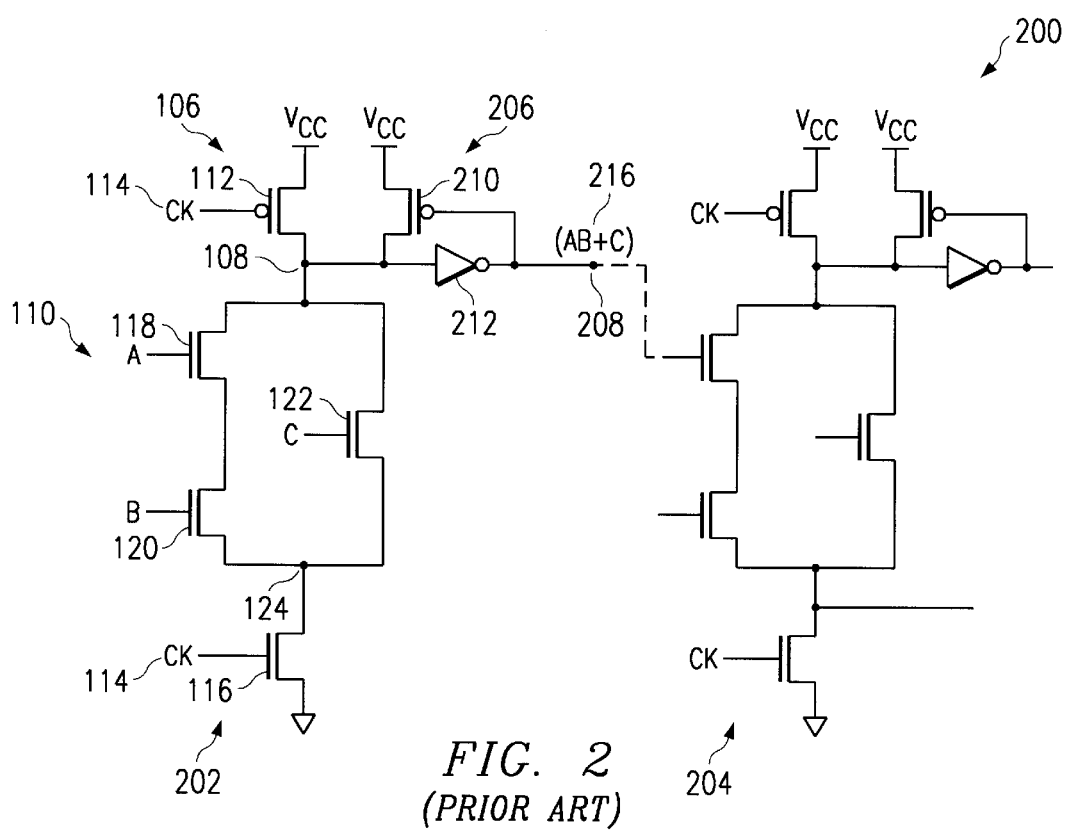
FIG. 2 is a schematic of a prior art CMOS dynamic logic circuit.

FIG. 2 illustrates a prior art attempt at dynamic logic circuitry 200 to overcome the limitations of circuits such as circuit 100. Circuit 200 implements a domino type of CMOS dynamic logic circuit, comprising multiple, serially-chained, stages such as stages 202 and 204. Stage 202 comprises essentially the same elements as stage 102 of FIG. 1 does; including pre-charge element 106 intercoupled between node 108 and a supply voltage ($V_{CC}$), and discharge element 110 intercoupled between node 108 and ground. Additionally, stage 202 comprises a charge hold element 206 intercoupled between node 108 and node 208. Output voltage for stage 202 is measured at node 208. Charge hold element 206 comprises transistor 210 having a first terminal coupled to $V_{CC}$, a second terminal coupled to node 108, and an inverting base terminal coupled to node 208. Hold element 206 further comprises inverter element 212 having an input coupled to node 108 and an output coupled to node 208. As described in reference to FIG. 1, transistors 118 and 120 are coupled serially between nodes 108 and 124, having base inputs A and B, respectively, and transistor 122 is coupled between nodes 108 and 124 in parallel to transistors 118 and 120 having base input C. Transistors 118–122 implement the Boolean condition 216 shown with the circuit.

Stage 202 operates through the pre-charge and evaluation modes responsive to clock input 114 as previously described. Transistor 210 and inverter 212 effectively form a loop used to address MOS leakage current effects on the node 108 voltage. Thus, once node 108 has been pre-charged, hold element 206 operates to keep the voltage at node 108 stable until condition 216 is satisfied and discharge element 110 discharges that voltage to a low level.

Although overcoming some of the power and reliability limitations of designs without charge hold elements, these designs still suffer negative effects of additional circuit elements. Design layout area is increased; negatively impacting device size, speed, and power consumption for such CMOS designs.

Figure 3:
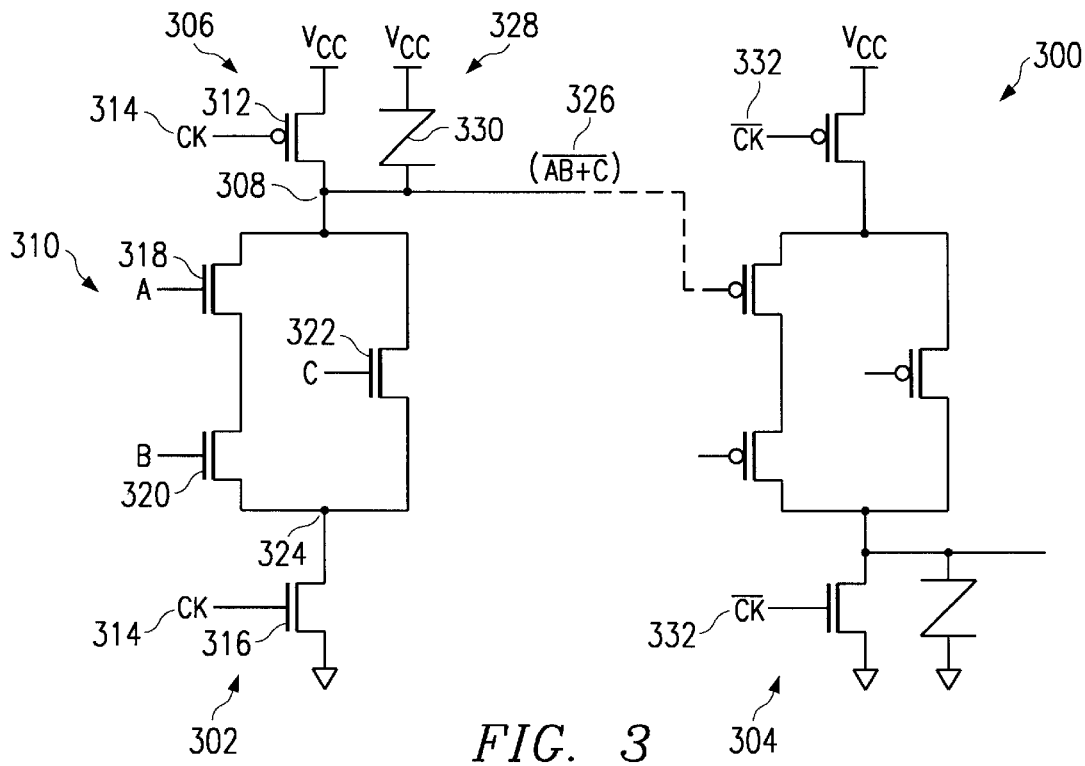
FIG. 3 is an illustrative embodiment of a CMOS dynamic logic circuit incorporating tunneling diodes according to the present invention.

In contrast to these conventional approaches, FIG. 3 illustrates a dynamic logic circuit 300 according to the present invention. For purposes of illustration, circuit 300 implements an np-CMOS type of dynamic logic circuit, comprising multiple, serially-chained, stages including n-type stage 302 and p-type stage 304. As should be apparent to those of skill in the art, the principles and teachings of the present invention will be equally applicable to other dynamic logic circuits and configurations. Stage 302 comprises pre-charge element 306 intercoupled between node 308 and a supply voltage ($V_{CC}$), and discharge element 310 intercoupled between node 308 and ground. Pre-charge element 306 comprises transistor 312 having a first terminal coupled to $V_{CC}$, a second terminal coupled to node 308, and an inverting base terminal coupled to a clock (CK) input 314. Discharge element 310 comprises an evaluation transistor 316 in combination with a network of transistors 318, 320, and 322. Transistor 316 has a first terminal coupled to node 324, a second terminal coupled to ground, and a base terminal coupled to clock input 314. Transistors 318 and 320 are coupled serially between nodes 308 and 324, having base inputs A and B, respectively. Transistor 322 is coupled between nodes 308 and 324 in parallel to transistors 318 and 320, and has base input C. Transistors 318–322 thus implement the Boolean condition 326 shown with the circuit.

During pre-charge phase, element 306 operates to raise the output voltage for stage 302, as measured at node 308, to a desired level(e.g. high or "1"). Stage 302 further comprises charge hold element 328 intercoupled between node 308 and $V_{CC}$. Element 328 comprises a resonant tunneling diode 330 having a first terminal coupled to node 308 and a second terminal coupled to $V_{CC}$. Element 328 operates to keep the voltage at node 308 stable until condition 326 is satisfied, discharging that voltage to a low level. Responsive to input 314, circuit 300 transitions into evaluation phase, in which transistor 316 turns on, effectively evaluating the status of condition 326 as implemented by transistors 318–322. If condition 326 is satisfied, a path from node 308 to ground will be established through transistor 316 and either transistor 322 or the combination of transistors 318 and 320. Once this path to ground is established, the voltage at node 308 will be discharged to a low level, shifting the output of stage 302. Stage 304 is structured and operates similarly to stage 302, responsive to inverse clock input 332.

Thus, by the present invention, diode 330 provides a state hold functionality compensating MOS leakage currents, stabilizing node 308 voltage, and providing a high reliability system.

Figure 4:
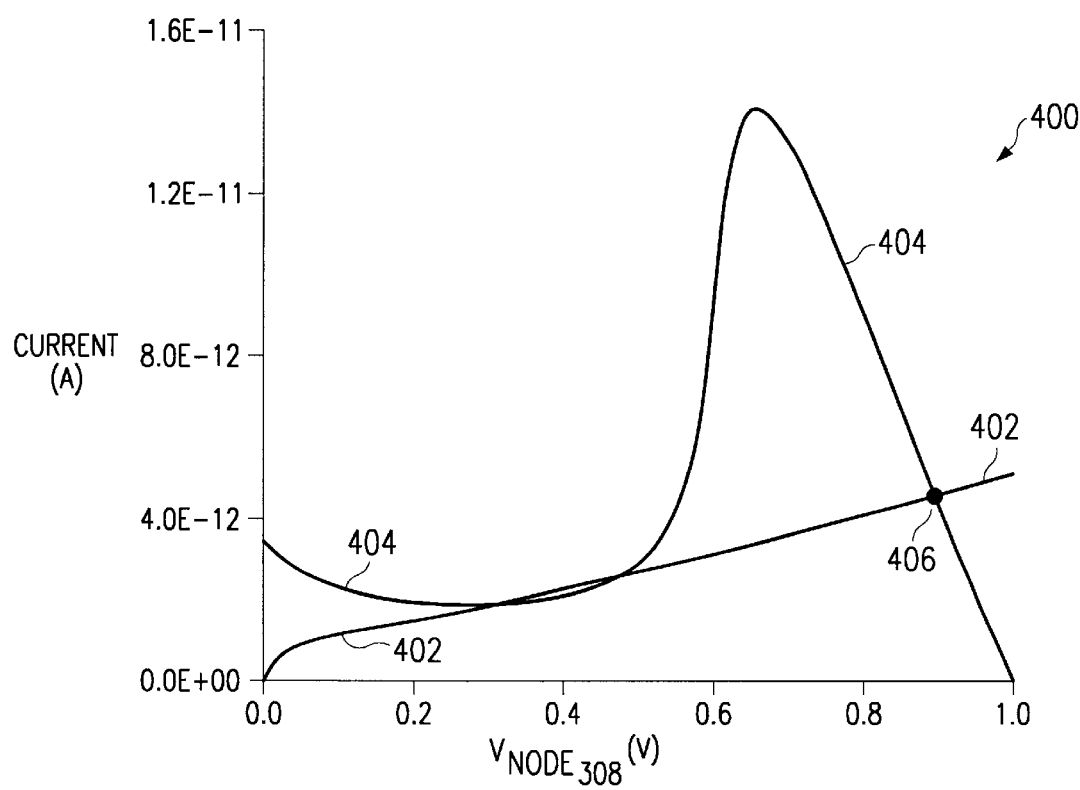
FIG. 4 is a graph illustrating characteristics of the circuit of FIG. 3.

FIG. 4 illustrates one advantage of the present invention. A current-voltage plot 400 shows critical characteristics of circuit 300.

Referring now jointly to FIGS. 3 and 4, curve 402 represents collective leakage current effects of transistors 316–322 while curve 404 represents the current-voltage characteristic of diode 330. Equilibrium state 406 represents a point at which the tunneling diode current equals the leakage current. Diode 330 thus compensates for the leakage current; the high peak current of diode 330 holds the voltage at node 308 at a high level. Errors resulting from leakage current are thus eliminated. The present invention thus provides high stability and overall design reliability.

With the present invention, a tunneling diode structure eliminates unnecessary inverter and transistor circuitry from a dynamic logic circuit. This results in CMOS/TD dynamic logic designs by the present invention having substantially smaller area, substantially higher speed, and substantially lower power consumption in comparison with conventional CMOS counterparts.

While this invention has been described in reference to illustrative embodiments, this description. is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A dynamic logic device comprising:
    dynamic logic circuitry including a logic block and clocked precharge and discharge transistors coupled to the logic block, and an output node coupled between the precharge transistor and the logic block; and
    tunneling structure circuitry, coupled to said output node, and adapted to compensate a leakage current originating from said dynamic logic circuitry.

2. The device of claim 1 wherein said device, including said tunneling structure circuitry, is fabricated in a CMOS process.

3. The device of claim 1 wherein said dynamic logic circuitry is adapted to evaluate a Boolean condition at the output node.

4. The device of claim 1 wherein said tunneling structure circuitry is a resonant tunneling diode.

5. The device of claim 1 wherein said tunneling structure circuitry is further adapted to hold said output node at a given voltage, said voltage supplied by the pre-charge transistor.

6. A semiconductor device performing signal processing operations, said device comprising:
    dynamic logic circuitry including a logic block and clocked precharge and discharge transistors coupled to the logic block, and an output node coupled between the precharge transistor and the logic block; and
    tunneling diode circuitry, coupled to said output node, and adapted to compensate a leakage current originating from said dynamic logic circuitry.

7. The device of claim 6 wherein said tunneling diode circuitry is further adapted to hold said output node at a given voltage, said voltage supplied by the pre-charge transistor.

8. The device of claim 6 wherein said tunneling diode circuitry comprises a resonant tunneling diode.

9. The device of claim 6 wherein said device, including said tunneling structure circuitry, is fabricated in a CMOS process.

10. The device of claim 6 wherein said dynamic logic circuitry is adapted to evaluate a specified Boolean condition at the output node.

11. A method of producing a dynamic logic device, said method comprising the steps of:
    providing a dynamic logic circuit including a logic block and clocked precharge and discharge transistors coupled to the logic block, and an output node coupled between the precharge transistor and the logic block;
    providing tunneling structure circuitry; and
    coupling said tunneling structure circuitry to said output node, and adapting said tunneling structure circuitry to compensate a leakage current originating from said dynamic logic circuit.

12. The method of claim 11 further comprising the step of fabricating said dynamic logic device, including said tunneling structure circuitry, in a CMOS process.

13. The method of claim 11 wherein the step of providing a dynamic logic circuit further comprises adapting said dynamic logic circuit to evaluate a specified Boolean condition, said condition being evaluated at the output node, at which said dynamic logic circuit and said tunneling structure circuit are jointly coupled.

14. The method of claim 11 wherein the step of providing tunneling structure circuitry further comprises providing a resonant tunneling diode.

15. The method of claim 13 wherein said tunneling structure circuitry is further adapted to hold said output node at a given voltage supplied by said pre-charge transistor.

* * * * *

UNITED STATES PATENT AND TRADEMARK OFFICE
CERTIFICATE OF CORRECTION

PATENT NO.    : 6,366,134 B1
DATED         : April 2, 2002
INVENTOR(S)   : Xiaowei Deng It is certified that error appears in the above-identified patent and that said Letters Patent is hereby corrected as shown below:

<u>Title page,</u>
Item [75], Inventor, correct the spelling of inventor's first name to -- Xiaowei --

Signed and Sealed this

Fourth Day of June, 2002

Attest:

Attesting Officer

JAMES E. ROGAN
*Director of the United States Patent and Trademark Office*